United States Patent
Takeuchi et al.

(10) Patent No.: US 7,884,387 B2
(45) Date of Patent: Feb. 8, 2011

(54) EPITAXIAL WAFER FOR SEMICONDUCTOR LIGHT EMITTING DIODE AND SEMICONDUCTOR LIGHT EMITTING DIODE USING SAME

(75) Inventors: Takashi Takeuchi, Hitachi (JP); Toshimitsu Sukegawa, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 127 days.

(21) Appl. No.: 12/134,271

(22) Filed: Jun. 6, 2008

(65) Prior Publication Data

US 2009/0140273 A1 Jun. 4, 2009

(30) Foreign Application Priority Data

Nov. 30, 2007 (JP) ............................. 2007-309650

(51) Int. Cl.
*H01L 33/00* (2010.01)
(52) U.S. Cl. .................. 257/99; 257/96; 257/E33.001; 438/47; 372/43.01
(58) Field of Classification Search .................. 257/79, 257/80, 82, 83, 94, 96, 99, 103, E33.054, 257/E33.077, E51.018, E33.001; 438/27, 438/46, 47; 372/43, 50, 43.01
See application file for complete search history.

(56) References Cited

U.S. PATENT DOCUMENTS

| 5,272,109 | A | * | 12/1993 | Motoda | ........................ 438/40 |
| 5,982,799 | A | * | 11/1999 | Bour et al. | ............. 372/50.121 |
| 6,563,850 | B1 | * | 5/2003 | Matsumoto et al. | ...... 372/45.01 |
| 6,834,068 | B2 | * | 12/2004 | Onishi | ........................ 372/50.1 |
| 7,449,720 | B2 | * | 11/2008 | Suzuki et al. | .................. 257/80 |
| 2006/0081872 | A1 | * | 4/2006 | Onishi | ........................ 257/103 |

FOREIGN PATENT DOCUMENTS

| JP | 2002-111052 | 4/2002 |
| JP | 2006-019695 | 1/2006 |
| JP | 2007-096267 | 4/2007 |

* cited by examiner

*Primary Examiner*—Thao X Le
*Assistant Examiner*—William F Kraig
(74) *Attorney, Agent, or Firm*—Antonelli, Terry, Stout & Kraus, LLP.

(57) ABSTRACT

An epitaxial wafer for a semiconductor light emitting device according to the present invention in which at least an n-type cladding layer formed with a mixed crystal made of an AlGaInP material, an active layer, a p-type Mg-doped cladding layer, and a p-type contact layer are stacked successively in that order on an n-type GaAs substrate, and the p-type contact layer is formed as at least two layers that are an Mg-doped contact layer and a Zn-doped contact layer stacked thereon when viewed from the n-type GaAs substrate, comprises a Zn-doped layer which is inserted between the p-type Mg-doped cladding layer and the p-type contact layer.

9 Claims, 3 Drawing Sheets

FIG. 1

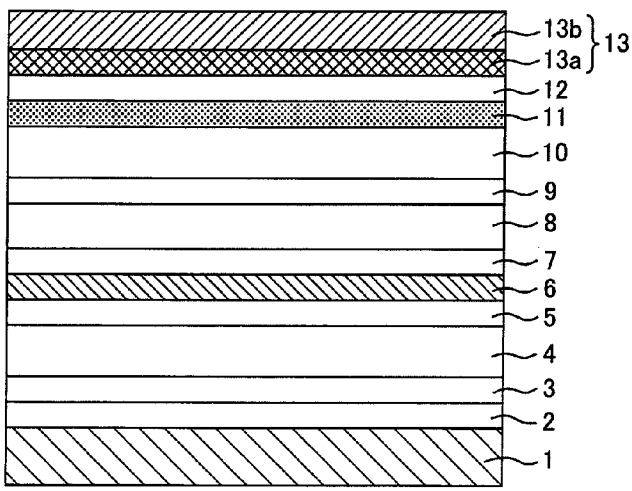

FIG. 2

| | EPITAXIAL LAYER | COMPOSITION AND STRUCTURE | THICKNESS [nm] | CARRIER DENSITY [cm$^{-3}$] |
|---|---|---|---|---|
| 13 {13b | CONTACT LAYER | Zn-DOPED GaAs | 300 | $5.0 \times 10^{18}$ |
| 13a | CONTACT LAYER | Mg-DOPED GaAs | 30 | $2.5 \times 10^{18}$ |
| 12 | INTERMEDIATE LAYER | Mg-DOPED Ga$_{0.51}$In$_{0.49}$P | 40 | $1.5 \times 10^{18}$ |
| 11 | Zn-DOPED LAYER | Zn-DOPED GaAs | 50 OR LESS | $1.0 \times 10^{19}$~$2.5 \times 10^{19}$ |
| 10 | SECOND p-TYPE CLADDING LAYER | Mg-DOPED (Al$_{0.7}$Ga$_{0.3}$)$_{0.51}$In$_{0.49}$P | 1500 | $1 \times 10^{18}$ |
| 9 | ETCH-STOP LAYER | un-Ga$_{0.55}$In$_{0.45}$P | 9 | — |
| 8 | FIRST p-TYPE CLADDING LAYER | Mg-DOPED (Al$_{0.7}$Ga$_{0.3}$)$_{0.51}$In$_{0.49}$P | 300 | $1 \times 10^{18}$ |
| 7 | UNDOPED GUIDE LAYER | un-(Al$_{0.5}$Ga$_{0.5}$)$_{0.51}$In$_{0.49}$P | 70 | — |
| 6 | ACTIVE LAYER | MQW: un-GaInP/ [un-(Al$_{0.5}$Ga$_{0.5}$)$_{0.51}$In$_{0.49}$P/ un-GaInP] × 3 | 49 | — |
| 5 | UNDOPED GUIDE LAYER | un-(Al$_{0.5}$Ga$_{0.5}$)$_{0.51}$In$_{0.49}$P | 15 | — |
| 4 | n-TYPE CLADDING LAYER | Si-DOPED (Al$_{0.68}$Ga$_{0.32}$)$_{0.51}$In$_{0.49}$P | 2000 | $8.5 \times 10^{17}$ |
| 3 | SECOND n-TYPE BUFFER LAYER | Si-DOPED Ga$_{0.51}$In$_{0.49}$P | 200 | $1 \times 10^{18}$ |
| 2 | FIRST n-TYPE BUFFER LAYER | Si-DOPED GaAs | 200 | $1 \times 10^{18}$ |
| 1 | SUBSTRATE | CONDUCTIVE n-TYPE GaAs SUBSTRATE | 500 μm | $1 \times 10^{18}$ |

EPITAXIAL WAFER FOR SEMICONDUCTOR LIGHT EMITTING DIODE AND SEMICONDUCTOR LIGHT EMITTING DIODE USING SAME

CLAIM OF PRIORITY

The present application claims priority from Japanese patent application serial no. 2007-309650 filed on Nov. 30, 2007, the content of which is hereby incorporated by reference into this application.

BACKGROUND OF THE INVENTION

1. Field of the Invention

The present invention relates to an epitaxial wafer used in a semiconductor light emitting device such as a light emitting diode or semiconductor laser as well as to a semiconductor light emitting device fabricated by using the epitaxial wafer.

2. Description of Related Art

The metal organic vapor phase epitaxy (MOVPE) method has been mainly used as a growth method of a crystal used in a semiconductor light emitting device. When a semiconductor crystal including compounds in the III and V groups is grown in this method, a substrate disposed in a vapor phase epitaxy apparatus is heated, after which a III-group metal organic raw gas, V-group raw gas, carrier gas, and dopant raw gas, which are used as raw materials of epitaxial layers, are supplied into an epitaxy furnace. Then, the resulting mixed gas is thermally decomposed in the furnace so that crystalline films are grown and stacked.

The epitaxial wafer for a semiconductor light emitting device obtained by the above MOVPE method is used in various types of semiconductor devices. Examples of these semiconductor devices include semiconductor laser diodes (LDs) used as light sources in read and write operations in optical disk systems, and light emitting diodes (LEDs) used in many applications including displays, remote controllers, sensors, and lamps in cars.

When an AlGaInP (aluminum-gallium-indium-phosphorus) crystal for a semiconductor light emitting device is grown in the MOVPE method, Zn (zinc) and Mg (magnesium) are generally used as p-type dopants. In particular, the Mg is often used in the p-type AlGaInP cladding layer in a compound semiconductor crystal for a high-output LD. This is because the Mg has a smaller diffusion coefficient than the Zn and is thereby hard to diffuse into the active layer, so the Mg can be doped at a relatively high concentration.

In the p-type contact layer, electrode contact resistance needs to be lowered as much as possible, so the carrier density in that layer needs to be higher than in the cladding layer by at least one order of magnitude. Accordingly, the p-type contact layer is generally formed with gallium arsenide (GaAs), and the Zn is used as the dopant. The Zn can be doped into GaAs at a high concentration of about $1\times10^{19}$ cm$^{-3}$, which is higher than the Mg can be doped.

On the other hand, light sources used for read and write operations in high-density optical disk drives are required to achieve a stable high-output operation even at high temperatures. To meet this requirement, the carrier density of the p-type cladding layer in the epitaxial wafer for a semiconductor light emitting device must be increased to about $1\times10^{18}$ cm$^{-3}$. In this case, the Mg doping is advantageous in less diffusion at a concentration order of $10^{18}$ cm$^{-3}$ because of its small diffusion coefficient, as mentioned before.

When the p-type cladding layer to which the Mg is doped is used, however, mutual diffusion of the Zn and Mg is prone to occur significantly; the Zn in the p-type contact layer diffuses up to the p-type cladding layer and active layer during the p-type contact layer is growing. As a result, the full width of half maximum of the photoluminescence spectrum in the active layer becomes large, causing critical problems such as deterioration in light emitting characteristics in the active layer and reduction in lifetime.

In order to solve these problems, various methods of preventing Zn from diffusing have been proposed. To prevent the Zn from diffusing from the substrate into the active layer, a method is disclosed in JP-A-2002-111052, in which a Zn diffusion preventing layer into which both the Zn and Si (silicon) are doped is provided between the substrate and the p-type cladding layer. In another method of preventing the Zn from diffusing from a p-type cap layer (p-type contact layer), which is disclosed in JP-A-2006-19695, the p-type cap layer is formed as at least two layers, which are an Mg-doped layer (which functions as the Zn diffusion preventing layer) and a Zn-doped layer stacked thereon when viewed from the substrate. In still another method, which is disclosed in JP-A-2007-96267, a p-type AlGaAs layer (which functions as the Zn diffusion preventing layer) into which C (carbon) is doped is inserted between the p-type cladding layer and the p-type cap layer.

According to the methods in JP-A-2006-19695 and JP-A-2007-96267, Zn diffusion from the Zn-doped p-type contact layer into the Mg-doped p-type cladding layer and undoped active layer is extremely efficiently suppressed to an extent at which there is almost no Zn diffusion.

If, however, the Zn diffusion from the p-type contact layer into the p-type cladding layer and the like is almost suppressed by the above-mentioned conventional methods, when a conventional device fabrication process has been tuned on the assumption that Zn diffusion occurs, the process may need to be significantly modified. In some cases, appropriate Zn diffusion may be effective to stabilize semiconductor light emitting device characteristics. Accordingly, if Zn diffusion from the p-type contact layer into the p-type cladding layer and the like is almost suppressed by the above conventional methods, a problem that semiconductor light emitting device characteristics become unstable arises.

SUMMARY OF THE INVENTION

Under these circumstances, the present invention addresses the above problems. It is an objective of the present invention to provide an epitaxial wafer for a semiconductor light emitting device in which the amount of Zn that diffuses from the p-type contact layer into the p-type cladding layer and active layer can be controlled and thereby an optimum Zn concentration is achieved in the p-type cladding layer and the like. Furthermore, it is another objective to provide a semiconductor light emitting device that is fabricated by using the epitaxial wafer and achieves a stable high-output operation even at high temperatures.

In order to achieve the objective described above, the present invention is structured as described below.

(1) According to one aspect of the present invention, an epitaxial wafer for a semiconductor light emitting device in which at least an n-type cladding layer formed with a mixed crystal made of an AlGaInP material, an active layer, a p-type Mg-doped cladding layer, and a p-type contact layer are stacked successively in that order on an n-type GaAs substrate; the p-type contact layer is formed as at least two layers that are an Mg-doped contact layer and a Zn-doped contact layer stacked thereon when viewed from the n-type GaAs substrate, comprises a Zn-doped layer which is configured between the p-type Mg-doped cladding layer and the p-type contact layer.

(2) According to another aspect of the present invention, an epitaxial wafer for a semiconductor light emitting device in which at least an n-type cladding layer formed with a mixed crystal made of an AlGaInP material, an active layer, a p-type Mg-doped cladding layer, a p-type Mg-doped intermediate layer, and a p-type contact layer are stacked successively in that order on an n-type GaAs substrate; the p-type contact layer is formed as at least two layers that are an Mg-doped contact layer and a Zn-doped contact layer stacked thereon when viewed form the n-type GaAs substrate, comprises a Zn-doped layer which is configured between the p-type Mg-doped cladding layer and the p-type Mg-doped intermediate layer.

In the above inventions (1) and (2), the following improvements and modifications can be made.

(i) The p-type Mg-doped intermediate layer is replaced by a p-type Zn-doped intermediate layer.

(ii) The Zn-doped layer is a Zn-doped GaAs layer.

(iii) The Zn-doped layer is a Zn planer-doped layer.

(iv) A semiconductor light emitting device according to the present invention is formed by using the above epitaxial wafer for a semiconductor light emitting device.

Advantages of the Invention

According to the present invention, it is possible to provide an epitaxial wafer for a semiconductor light emitting device in which diffusion of an appropriate (optimum) amount of Zn into the Mg-doped p-type cladding layer and active layer is occurred during the growth. Furthermore, it is possible to provide a highly reliable semiconductor light emitting device that achieve a stable high-output operation even at high temperatures by using the epitaxial wafer, without having to modify a conventional device fabrication process.

BRIEF DESCRIPTION OF THE DRAWINGS

FIG. 1 is a schematic illustration showing a cross sectional view of an example of an epitaxial wafer for a semiconductor light emitting device in an embodiment according to the present invention.

FIG. 2 is a table indicating a structure of an epitaxial wafer for a semiconductor light emitting device in Example 1 of the present invention.

DETAILED DESCRIPTION OF THE PREFERRED EMBODIMENTS

Figure 3A:
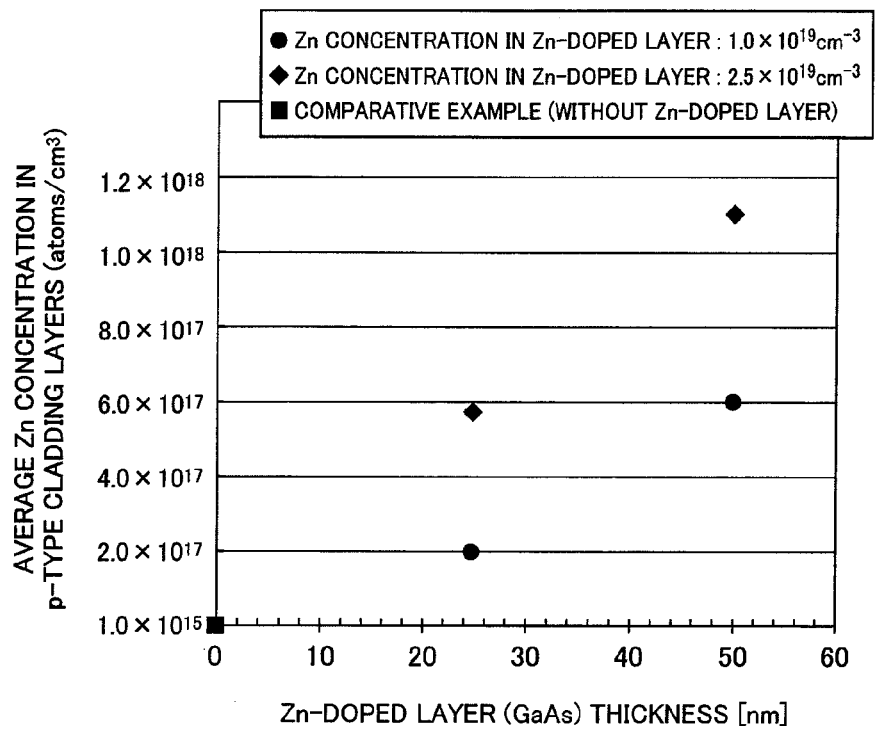
FIG. 3A is a graph showing a relationship between average Zn concentration in the p-type cladding layers and thickness of a Zn-doped GaAs layer in Example 1 of the present invention, the Zn concentration being measured with a secondary ion mass spectrometry (SIMS).

A preferred embodiment of the present invention will be described in detail with reference to the attached drawings. However, the present invention is not limited to the embodiments described herein.

FIG. 1 is a schematic illustration showing a cross sectional view of an example of an epitaxial wafer for a semiconductor light emitting device (e.g., semiconductor laser) in this embodiment. As shown in FIG. 1, the epitaxial wafer for a semiconductor light emitting device in this embodiment is formed by stacking successively on an n-type GaAs substrate 1: a first n-type buffer layer 2 made of GaAs; a second n-type buffer layer 3 made of GaInP; an n-type cladding layer 4 made of AlGaInP; an undoped guide layer 5 made of AlGaInP; an active layer 6 having a multiple quantum well (MQW) structure including a GaInP well and AlGaInP barrier; an undoped guide layer 7 made of AlGaInP; a first p-type Mg-doped cladding layer 8 made of AlGaInP; an etch-stop layer 9 made of GaInP; a second p-type Mg-doped cladding layer 10 made of AlGaInP; a Zn-doped layer 11 made of GaAs; a p-type Mg-doped intermediate layer 12 made of GaInP; and a p-type contact layer 13 made of GaAs.

The p-type intermediate layer 12 made of GaInP is provided to reduce an interfacial resistance component due to band gap discontinuity between the second p-type cladding layer 10 made of AlGaInP and the p-type contact layer 13 made of GaAs. The p-type contact layer 13 has a two-layer structure in which an Mg-doped contact layer 13a made of GaAs is provided and a Zn-doped contact layer 13b made of GaAs is stacked thereon when viewed from the n-type GaAs substrate 1. The Zn-doped contact layer 13b of the p-type contact layer 13 needs to have a high Zn concentration to reduce the resistance of a contact with an electrode. Since the Zn-doped contact layer 13b is made of GaAs, the Zn can be doped into the Zn-doped contact layer 13b at a high concentration.

Due to the two-layer structure of the p-type contact layer 13, in which the Mg-doped contact layer 13a and Zn-doped contact layer 13b are stacked in that order when viewed from the n-type GaAs substrate 1, the Mg-doped contact layer 13a functions as a Zn diffusion preventing layer which prevents the Zn in the Zn-doped contact layer 13b from diffusing. The Zn in the Zn-doped contact layer 13b thereby hardly diffuses through the Mg-doped contact layer 13a into the p-type intermediate layer 12 and second p-type cladding layer 10. If, however, there is almost no Zn diffusion from the p-type contact layer 13 into the second p-type cladding layer 10, when a conventional device fabrication process has been tuned on the assumption which a Zn diffusion occurs, the process may need to be significantly modified. For addressing this problem, it is necessary to allow diffusion of an appropriate amount of Zn into the p-type cladding layers (10 and 8) and active layer 6, which are adaptable to the conventional device fabrication process.

In order to allow diffusion of an appropriate amount of Zn, firstly, the p-type contact layer 13 is formed with two layers comprising the Mg-doped contact layer 13a and Zn-doped contact layer 13b so that Zn diffusion from the p-type contact layer 13 into the second p-type cladding layer 10 is avoided or suppressed to a state in which there is almost no diffusion. In turn, to have an optimum amount of Zn diffuse into the second p-type cladding layer 10, the Zn-doped layer 11 is provided as a Zn diffusion adjusting layer (Zn diffusion source) between the second p-type cladding layer 10 and p-type intermediate layer 12. When the thickness of the Zn-doped layer 11, the concentration of Zn, or both are adjusted and set (that is, when an absolute (total) amount of Zn dopant is controlled), the optimum amount of Zn that diffuses into the second p-type cladding layer 10 can be controlled. Since the Zn-doped layer 11 is made of GaAs, even if the Zn-doped layer 11 needs to be thinned, Zn can be doped at a high concentration. The amount of Zn which is made to diffuse can thus be adjusted easily.

When this structure is adopted, an epitaxial wafer for a semiconductor light emitting device in which an optimum amount of Zn diffuses into the p-type cladding layers (10 and 8) and active layer 6 is obtained without having to modify a conventional device fabrication process. In other words, because the amount of Zn that diffuses into the p-type cladding layers (10 and 8) and active layer 6; the amount of Zn doped into the p-type contact layer 13 can be controlled separately, control precision and reproducibility can be improved. Furthermore, it is possible to fabricate a highly reliable semiconductor light emitting device that can achieve a stable high-output operation even at high temperatures by using the obtained epitaxial wafer.

Although, in the above embodiment, the Zn-doped layer 11 formed by doping Zn into GaAs has been used as the Zn diffusion adjusting layer (Zn diffusion source) for setting or controlling an optimum amount of Zn that diffuses into the second p-type cladding layer 10, a Zn planer doping may be carried out behind the laminated second p-type cladding layer 10 and in front of the laminated p-type contact layer 13 to form a Zn planer-doped layer; the Zn planer-doped layer may then be used as the Zn diffuse adjusting layer, instead of using the Zn-doped layer 11. In this case, when a Zn flow rate during Zn planer doping, a planer doping time, or both are adjusted, the amount of Zn that diffuses into the second p-type cladding layer 10 can be controlled.

Although, in the above embodiment, Mg has been doped into the p-type intermediate layer 12, Zn may be doped instead of Mg. Alternatively, in the above embodiment, the p-type intermediate layer 12 may be omitted when there is almost no problem of the interfacial resistance component due to band gap discontinuity.

EXAMPLES

Next, the present invention will be specifically described by using an example; however, the present invention is not intended to be limited by the example.

Example 1

An epitaxial wafer for a semiconductor light emitting device (semiconductor laser) in Example 1 has the same cross sectional structure as in the above embodiment shown in FIG. 1. Detail specifications, e.g., composition, structure, thickness, and carrier density of each epitaxial layer are shown in FIG. 2. FIG. 2 is a table indicating a structure of an epitaxial wafer for a semiconductor light emitting device in Example 1 of the present invention. The symbol "un-" in FIG. 2 represents "undoped".

As shown in FIG. 2, the epitaxial wafer for a semiconductor light emitting device in Example 1 has, on an n-type GaAs substrate 1 made of GaAs: a first buffer layer 2 made of GaAs; a second buffer layer 3 made of $Ga_{0.51}In_{0.49}P$; an n-type cladding layer 4 made of $(Al_{0.68}Ga_{0.32})_{0.51}In_{0.49}P$; an undoped guide layer 5 made of $(Al_{0.50}Ga_{0.50})_{0.51}In_{0.49}P$; an active layer 6 having a multiple quantum well (MQW) structure; an undoped guide layer 7 made of $(Al_{0.50}Ga_{0.50})_{0.51}In_{0.49}P$; a first p-type cladding layer 8 made of $(Al_{0.70}Ga_{0.30})_{0.51}In_{0.49}P$; an etch-stop layer 9 made of $Ga_{0.55}In_{0.45}P$; a second p-type cladding layer 10 made of $(Al_{0.70}Ga_{0.30})_{0.51}In_{0.49}P$; a Zn-doped layer 11 made of GaAs; a p-type intermediate layer 12 made of $Ga_{0.51}In_{0.49}P$; and a p-type contact layer 13 made of GaAs, all of which are grown in succession in that order. The p-type contact layer 13 has a two-layer structure in which an Mg-doped contact layer 13a is provided and a Zn-doped contact layer 13b is stacked thereon when viewed from the substrate. The quantum well structure of the active layer 6 includes $Ga_{0.51}In_{0.49}P$ as a well and $(Al_{0.50}Ga_{0.50})_{0.51}In_{0.49}P$ as a barrier; no impurity is added.

The metal organic vapor phase epitaxy (MOVPE) method was used to cause the above epitaxial layers to grow. Specifically, the n-type GaAs substrate 1 which was disposed in an epitaxy furnace of a vapor phase epitaxy apparatus was heated, a III-group metal organic raw gas, V-group raw gas, carrier gas, and dopant raw gas necessary for the epitaxial layers 2 to 13 were supplied to the epitaxy furnace, and the gases were thermally decomposed in the furnace so that epitaxial crystals were grown by being stacked in succession on the n-type GaAs substrate 1.

To prepare the III-group metal organic raw gas, the trim-ethyl-gallium (TMG) was used as a source of Ga component, trimethyl-aluminum (TMA) was used as a source of Al component, and trimethyl-indium (TMI) was used as a source of In component. To prepare the V-group metal organic raw gas, $AsH_3$ was used as a source of As component, and $PH_3$ (phosphine) was used as a source of P component. To prepare the dopant raw gas, $Si_2H_6$ (disilane) was used as a source of Si component, which is an n-type impurity, bis-cyclopentadi-enyl-magnesium ($Cp_2Mg$) was used as a source of Mg component, which is a p-type impurity, and diethyl-zinc (DEZ) was used as a source of Zn component. To prepare the carrier gas, a highly purified hydrogen gas was used.

Figure 3B:
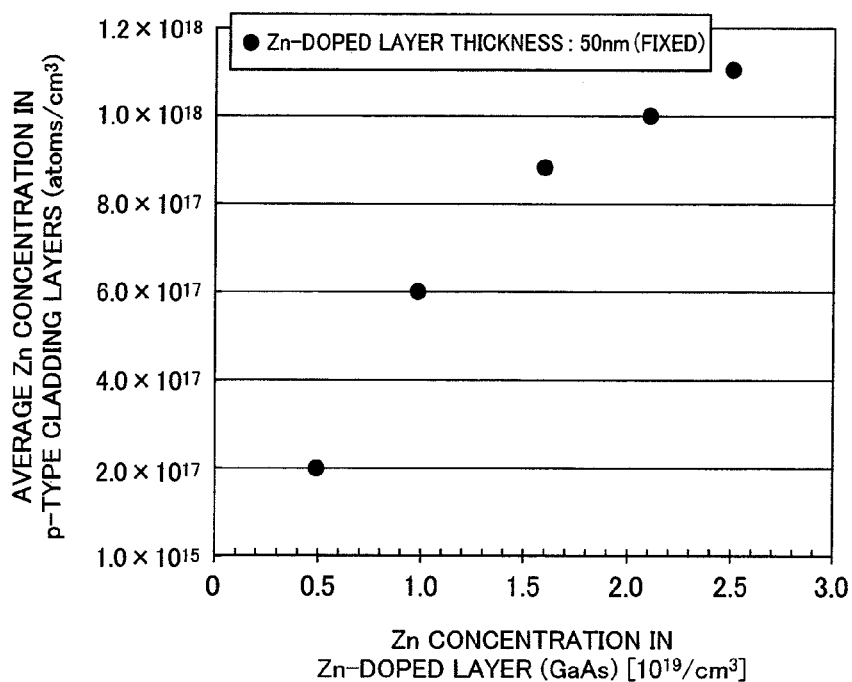
FIG. 3B is a graph showing a relationship between average Zn concentration in the p-type cladding layers and Zn concentration in a Zn-doped GaAs layer in Example 1 of the present invention, the Zn concentration being measured with the SIMS.

In Example 1, the influence of the amount of Zn that diffused into the second p-type cladding layer 10 was investigated by changing a thickness of and a Zn concentration in the Zn-doped layer 11 grown on the second p-type cladding layer 10. Experimental results are shown in FIGS. 3A and 3B. FIG. 3A is a graph showing a relationship between average Zn concentration in the p-type cladding layers and thickness of the Zn-doped GaAs layer in Example 1 of the present invention; FIG. 3B is a graph showing a relationship between average Zn concentration in the p-type cladding layers and Zn concentration in the Zn-doped GaAs layer in Example 1 of the present invention. In FIGS. 3A and 3B, average Zn concentration in the p-type cladding layers means average Zn concentration in the epitaxial layers from the first p-type cladding layer 8 to the second p-type cladding layer 10. The Zn concentration was measured with a secondary ion mass spectrometry (SIMS).

In the measurement in FIG. 3A, the Zn concentration of the Zn-doped layer 11 was fixed to $1.0 \times 10^{19}$ $cm^{-3}$ or $2.5 \times 10^{19}$ $cm^{-3}$, and the thickness of the Zn-doped layer 11 was changed. In the measurement in FIG. 3B, the thickness of the Zn-doped layer 11 was fixed to 50 nm, and the Zn concentration in the Zn-doped layer 11 was changed. On the other hand, an epitaxial wafer for a semiconductor light emitting device having the same structure as in Example 1 except that the Zn-doped layer 11 was eliminated was fabricated as Comparative example. FIG. 3A also shows results in Comparative example.

FIGS. 3A and 3B indicate that when the Zn-doped layer 11 is provided, the average Zn concentration in the first p-type cladding layer 8 to second p-type cladding layer 10 can be adjusted in the range of $1 \times 10^{15}$ $cm^{-3}$ to $1.2 \times 10^{18}$ $cm^{-3}$. The value of $1 \times 10^{15}$ $cm^{-3}$ is applicable to Comparative example in which the Zn-doped layer 11 is eliminated. Furthermore, it was confirmed that device characteristics of a red semiconductor laser which was fabricated by using the epitaxial wafer for a semiconductor light emitting device in Example 1 and by an ordinary device fabrication process were very preferable.

Example 2

Example 2 differs from Example 1 in that after the second p-type cladding layer 10 made of AlGaInP was grown, Zn planer doping was carried out to form the Zn planer-doped layer, instead of stacking the Zn-doped layer 11 made of GaAs on the second p-type cladding layer 10 as in Example 1. The other aspects were the same as in Example 1.

Figure 4A:
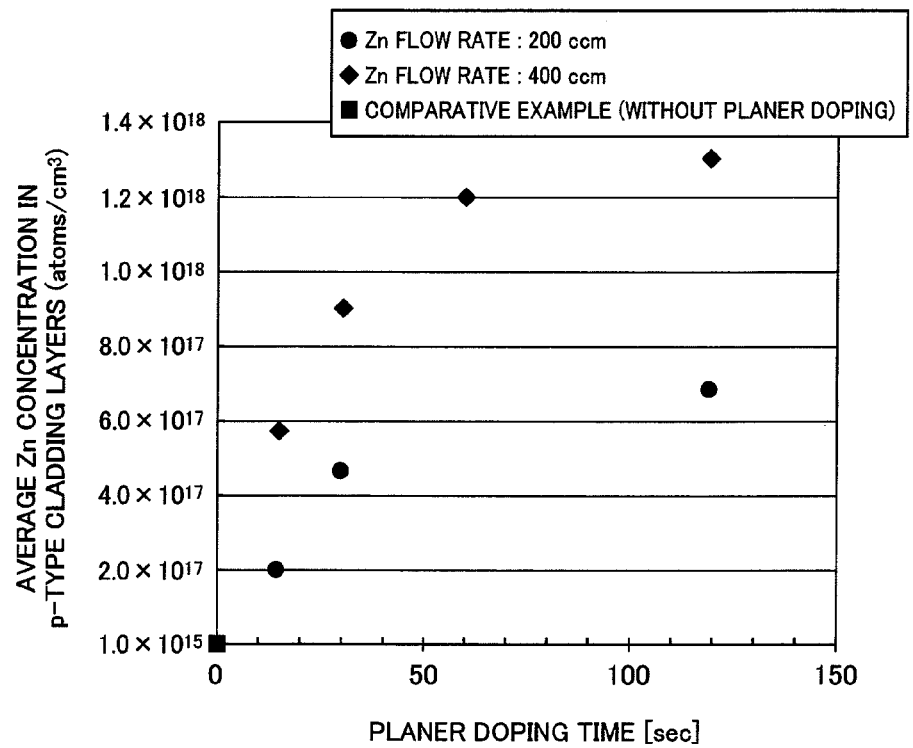
FIG. 4A is a graph showing a relationship between average Zn concentration in the p-type cladding layers and a planer doping time during the growth in Example 2 of the present invention, the Zn density being measured with the SIMS.
Figure 4B:
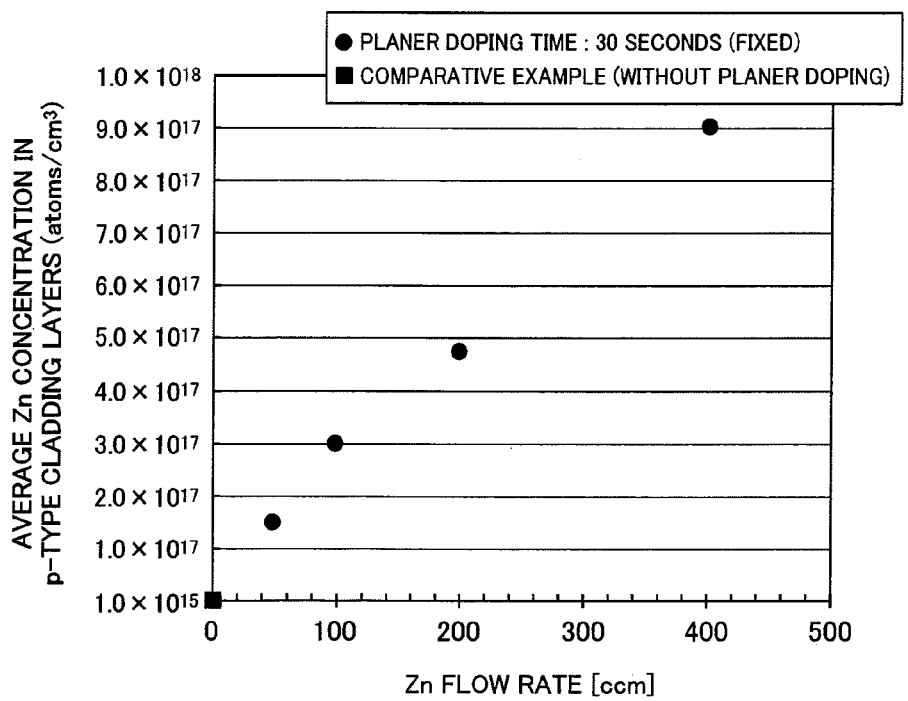
FIG. 4B is a graph showing a relationship between average Zn concentration in the p-type cladding layers and a Zn flow rate during the planer doping in Example 2 of the present invention, the Zn density being measured with the SIMS.

In Example 2, the Zn flow rate during planer doping and a time of the planer doping were changed to investigate the influence to the amount of Zn which diffused into the second p-type cladding layer 10. Experimental results are shown in FIGS. 4A and 4B. FIG. 4A is a graph showing a relationship between average Zn concentration in the p-type cladding layers and the planer doping time during the growth in Example 2 of the present invention; FIG. 4B is a graph showing a relationship between average Zn concentration in the p-type cladding layers and the Zn flow rate during the planer doping in Example 2 of the present invention. As mentioned above, average Zn concentration in the p-type cladding layers means average Zn concentration in the epitaxial layers from the first p-type cladding layer 8 to the second p-type cladding layer 10. The Zn concentration was measured with the SIMS.

In the measurement in FIG. 4A, the Zn flow rate was fixed to 200 or 400 ccm, and the planer doping time was changed. In the measurement in FIG. 4B, the planer doping time was fixed to 30 seconds, and the Zn flow rate was changed. Similarly in aforementioned Example 1Comparative example of the epitaxial wafer for a semiconductor light emitting device was prepared, in which the Zn-doped layer 11 was not stacked and the planer doping was not carried out. FIGS. 4A and 4B also show results in Comparative example.

FIGS. 4A and 4B indicate that when the Zn planer-doped layer is provided, the average Zn concentration in the first p-type cladding layer 8 to second p-type cladding layer 10 can be adjusted in the range of $1 \times 10^{15}$ cm$^{-3}$ to $1.3 \times 10^{18}$ cm$^{-3}$. Furthermore, it was confirmed that device characteristics of a red semiconductor laser which was fabricate by using the epitaxial wafer in Example 2 and by an ordinary device fabrication process were very preferable.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An epitaxial wafer for a semiconductor light emitting device, comprising an n-type GaAs substrate and a plurality of layers stacked on the n-type GaAs substrate, the plurality of layers including at least:

an n-type cladding layer formed with a mixed crystal made of an AlGaInP material; an active layer containing a multiple quantum well structure; a p-type Mg-doped cladding layer; a p-type Mg-doped intermediate layer; and a p-type contact layer, which are stacked successively in that order on the n-type GaAs substrate, wherein the p-type contact layer comprises a p-type Mg-doped contact layer and a p-type Zn-doped contact layer, the p-type Mg-doped contact layer is between the p-type Mg-doped cladding layer and the p-type Zn-doped contact layer; and further including a Zn-doped layer between the p-type Mg-doped cladding layer and the p-type Mg-doped intermediate layer, the Zn-doped layer adjusting Zn diffusion into the p-type Mg-doped cladding layer, wherein Zn concentration of the Zn-doped layer is within a range from $1.0 \times 10^{19}$ to $2.5 \times 10^{19}$ cm$^{-3}$.

2. The epitaxial wafer for a semiconductor light emitting device according to claim 1, wherein:

the p-type Mg-doped intermediate layer is replaced by a p-type Zn-doped intermediate layer.

3. The epitaxial wafer for a semiconductor light emitting device according to claim 2, wherein:

the p-type Zn-doped intermediate layer is a p-type Zn-doped GaInP layer.

4. The epitaxial wafer for a semiconductor light emitting device according to claim 1, wherein:

the Zn-doped layer is a Zn-doped GaAs layer.

5. The epitaxial wafer for a semiconductor light emitting device according to claim 1, wherein:

the Zn-doped layer is a Zn planer-doped layer.

6. A semiconductor light emitting device formed by using the epitaxial wafer for a semiconductor light emitting device according to claim 1.

7. The epitaxial wafer for a semiconductor light emitting device according to claim 1, wherein:

a thickness of the Zn-doped layer is 50 nm or less.

8. The epitaxial wafer for a semiconductor light emitting device according to claim 1, wherein:

average Zn concentration in the p-type Mg-doped cladding layer is more than $1 \times 10^{15}$ cm$^{-3}$ and $1.3 \times 10^{18}$ cm$^{-3}$ or less.

9. The epitaxial wafer for a semiconductor light emitting device according to claim 1, wherein:

the p-type Mg-doped intermediate layer is a p-type Mg-doped GaInP layer.

* * * * *